United States Patent [19]

Grossa et al.

[11] Patent Number: 4,539,287

[45] Date of Patent: Sep. 3, 1985

[54] PROCESS FOR IMPROVING THE PRINTING QUALITY OF PHOTOHARDENABLE REPRODUCTION MATERIALS

[75] Inventors: Mario Grossa, Dreieich; Dieter H. Tigler, Rodermark; Hubert Weinert, Langen, all of Fed. Rep. of Germany

[73] Assignee: E. I. Du Pont de Nemours and Company, Wilmington, Del.

[21] Appl. No.: 572,114

[22] Filed: Jan. 19, 1984

Related U.S. Application Data

[63] Continuation-in-part of Ser. No. 378,395, May 14, 1982, abandoned.

[30] Foreign Application Priority Data

Jun. 29, 1981 [DE] Fed. Rep. of Germany ....... 3125564

[51] Int. Cl.$^3$ .............................................. G03C 5/00
[52] U.S. Cl. ................................... 430/300; 430/306; 430/327; 430/950; 430/961; 430/325
[58] Field of Search ............... 430/327, 950, 961, 300, 430/306, 325

[56] References Cited

U.S. PATENT DOCUMENTS

| | | | |
|---|---|---|---|
| 3,529,960 | 9/1970 | Sloan | 430/327 |
| 3,535,157 | 10/1970 | Steinhoff et al. | 430/327 |
| 3,544,350 | 12/1970 | Veirs | 430/327 |
| 4,212,935 | 7/1980 | Canavello et al. | 430/327 |
| 4,218,533 | 8/1980 | Fuchigami et al. | 430/950 |
| 4,226,933 | 10/1980 | Ishizawa et al. | 430/961 |
| 4,268,602 | 5/1981 | Yoshino et al. | 430/327 |
| 4,292,389 | 9/1981 | Kojima et al. | 430/950 |
| 4,315,985 | 2/1982 | Castellani et al. | 430/327 |

FOREIGN PATENT DOCUMENTS 1579817 11/1980 United Kingdom .

*Primary Examiner*—Jack P. Brammer

[57] ABSTRACT

Process for improving the printing quality of photohardenable reproduction materials for the production of relief printing plates whose surface has been abraded before imagewise exposure, by filling in the abraded relief with the photohardenable material itself or with a thermoplastic binder.

10 Claims, No Drawings

PROCESS FOR IMPROVING THE PRINTING QUALITY OF PHOTOHARDENABLE REPRODUCTION MATERIALS

CROSS REFERENCE TO RELATED APPLICATION

This application is a continuation-in-part application of Ser. No. 378,395, filed May 14, 1982, now abandoned.

DESCRIPTION

1. Technical Field

The invention relates to a process for improving the printing quality of photohardenable reproduction materials with an abraded surface for producing printing plates for relief printing.

2. Background Art

Printing plates made of photohardenable mixtures are being used more extensively in the area of relief printing. These photohardenable mixtures are mostly coated onto a support film and consist essentially of a photopolymerizable or photocrosslinkable compound, a thermoplastic binder, and an initiator and/or an initiator system. The photohardenable layer can be washed off after imagewise exposure to form relief images, which can be used directly as printing plates. Printing plates prepared in this way excel primarily by a defined relief, i.e., by a clear difference in height between the printing and nonprinting areas, and make possible a true reproduction of the transparent copy with a high quality of detail.

It is necessary for various purposes of application, especially for the production of seamless printing cylinders, either to apply the photohardenable material onto the printing cylinder in a liquid form without seams or to mount the photohardenable material fixed on a support film on the printing cylinder or a removable cylinder coating formed thereupon, so that the seam does not appear in the printed image. Such work must be carried out with the unexposed, i.e., nonphotopolymerized or noncrosslinked material, and can lead to differences in thickness within the photohardenable material, which can increase the "runout" or asymmetry of rotation of the printing cylinder and thus lower the printing quality.

In such instances, in order to achieve the necessary printing thickness tolerance, which is about ±0.015 mm, it is necessary to carry out a precision abrasion process before exposure. This abrasion process, however, results in the formation of a microscopically rough surface in the photohardenable material grooves up to about 20 μm depth, i.e., from the top of the peak to the bottom of the valley and lateral separation between peaks being about 30 to 50 μm. Actual practice, however, has shown that the printing quality is quite considerably lowered by this abrasion process. In particular after development there is insufficient relief depth, leading to poor reproduction quality of fine line image elements. Insufficient relief depth, moreover, lowers resistance to press runs, an action further reinforced by the increased friction caused by the abraded surface.

Therefore, it is an object of the present invention to improve the printing quality of photohardenable reproduction materials for the production of relief printing plates which contain a thermoplastic binder and have an abraded surface.

DISCLOSURE OF THE INVENTION

In accordance with this invention there is provided a process for improving the printing quality of dry photohardenable reproduction materials for the production of relief printing plates consisting essentially of
 (a) abrading the dry photohardenable surface of the material which consists essentially of a photopolymerizable or photocrosslinkable compound, a thermoplastic binder, and an initiator and/or an initiator system thereby forming a rough surface in the photohardenable material with grooves in the range up to about 20 μm depth,
 (b) smoothing the abraded dry photohardenable surface by filling in the abraded surface by a treatment taken from the group consisting of
  (1) heat and/or pressure treatment,
  (2) treatment with an organic solvent and/or solvent mixture for the thermoplastic binder of the photohardenable material, and
  (3) treatment with a thermoplastic binder dissolved in a solvent, the surface having a depth of grooves no greater than about 2 μm after the treatment
 (c) exposing the smoothed surface imagewise to actinic radiation, and
 (d) removing the unexposed areas of the smoothed surface by liquid development.

The phrase "abrading the dry photohardenable surface" means that the photohardenable material is mechanically removed to eliminate variability in radial thickness when the photohardenable material is on a cylindrical surface or variability in thickness when the photohardenable material is in flat mode, the maximum allowable thickness variation being ±0.015 mm. The abrading forms a uniform rough surface containing grooves having a maximum depth of about 20 μm from the top of the peak to the bottom of the valley and lateral separation between peaks being about 30 to 50 μm. Generally grooves in the depth range of 5 to 20 μm are present. The abrading is accomplished with, e.g., a wheel having a carborundum surface or other abrasive surface. The abrasive material must not be too fine or the wheel may bind on the surface of the photohardenable material. If the abrasive material is too coarse, the surface roughness may exceed the values specified above. The rate of abrasion is about 50 to 200 cm²/minute or more, preferably about 80 cm²/minute. The thickness variation can be determined, for example, by use of a rotary wheel, e.g., 1 cm in width, which is positioned on top of a printing cylinder bearing the photohardenable material. Upon rotation of the printing cylinder, the runout or asymmetry of rotation of the photohardenable material can be determined. The depth of the grooves, however, is not determined by this means but can be determined by an optical microscope, e.g., Zeiss microscope for measurement of gravure cells.

The phrase "smoothing the abraded dry photohardenable surface" means that the abraded uniform rough surface is smoothed by one of the methods specified above and described more fully below to fill in the grooves so that the depth thereof is no more than 2 μm and preferably no more than 1 μm. The extent of the smoothing can be determined by measurement, e.g., optical microscope as described above or visually when the surface of the photohardenable material appears completely smooth and glossy.

It is possible by the process of the invention, even using photohardenable materials with an abraded surface, to attain relief depths after imagewise exposure and washoff or liquid development which correspond to those of nonabraded printing plates. As a result of the improvement of the relief quality, there is an improvement in detail rendition of the plate. Depending on the choice of the smoothing method, the number of printing impressions also can be increased so that the number of impressions is equivalent to that of nonabraded material.

The smoothing of the abraded surface can be undertaken according to various methods. According to an especially preferred embodiment smoothing of the abraded surface can be accomplished solely by the use of heat and/or pressure on the abraded photohardenable material. The photohardenable material itself fills in the grooves of the abraded surface without need for addition of any photohardenable material. Especially good results can be attained when the abraded plate surface is smoothed by a pressure treatment at elevated temperature.

According to a preferred embodiment, onto a metal cylinder or a removable cylinder coating found thereupon is applied a seamless coating of the photohardenable material. The surface of the photohardenable material is then abraded to tolerance thickness described above and the printing cylinder is supported between two roller bearings. A rotating metal roller with a smooth polished surface parallel to the pressure cylinder is heated and under pressure is brought in contact with the plate surface of the similarly rotating printing cylinder. After a few minutes the previously rough, matte surface of the photohardenable material fixed on the printing cylinder is smooth and has a glossy appearance. Pressure can be produced in various ways according to state of the art methods. Thus, pressure can be produced by a flexible, preferably springy, contact of the heated roller with the cylinder and/or cylinder coating covered with the abraded photohardenable material. It is, however, also possible to apply the pressure by the inherent weight of the printing cylinder, in that the printing cylinder coated with the abraded photohardenable material is made to run on a heated roller rotating about a horizontal axis and optionally on at least one additional guide roller or in another guide surface. In other instances it may be sufficient to roll the printing cylinder with the photohardenable material mounted thereupon with the abraded surface over a smooth, polished, and heated metal surface.

Depending on the type of photohardenable material in many instances even a simple heat treatment will suffice, e.g., the abraded surface can be exposed to infrared radiation. If the second order transition temperature of the photohardenable material is close to room temperature, even the use of pressure alone, such as e.g., a pressure treatment in the cold or a simple rolling with a nonheated metal cylinder will suffice to smooth the abraded surface.

The temperatures to be used for smoothing the abraded surface depend on the composition of the photohardenable material and should lie between the second order transition temperature and the melting temperature. Thus, e.g., temperatures from 100°–120° C. are preferred for materials, which contain a thermoplastic, elastomeric block copolymer with a polystyrene block as the binder. The pressure to be applied can be selected as a function of the composition of the photohardenable material within a range from 0.05–0.6 $kg/cm^2$.

According to another embodiment, smoothing can take place by treatment of the abraded surface using an organic solvent and/or solvent mixture for the thermoplastic binder of the photohardenable material, which is suitable to bring about a partial solution of the photohardenable material which fills in the abraded surface without addition of any photohardenable material or other additive. Such solvents are widely known. Especially well suited solvents are: methylene chloride, di- and trichloroethanes, trichloroethylene, tetrachloroethylene, carbon tetrachloride, chlorobenzene, benzene, toluene, xylene, and cyclohexane. In addition, esters, ethers, and ketones are suitable, such as e.g., acetic acid ethyl ester, benzoic acid methyl ester, diethyl ether, tetrahydrofuran, methyl ethyl ketone, cylcohexanone, methyl propyl ketone, and methyl isobutyl ketone. It is often advantageous to use these solvents in mixture with a nonsolvent, e.g., methanol, ethanol, propanol, or butanol in order to control the solution and/or swelling properties. The selection of the respectively suitable solvent and/or solvent mixture is possible based on general knowledge in this area and is of no difficulty to those skilled in the art.

The application of the solvent can take place manually, e.g., by using a cotton pad, sponge, or brush or by dipping the abraded surface of the photohardenable material into a solvent bath. Naturally, the solvent can also be applied by machine or by spraying or rinsing. By application of the solvent and/or solvent mixture on the abraded surface, the smoothing thereof is to a roughness variation of about 2 μm or less, i.e., within accepted roughness tolerance limits.

According to a further embodiment, smoothing of the abraded surface can take place by filling in the abraded relief with a thermoplastic binder. For this purpose, the thermoplastic binder dissolved in a suitable solvent is applied before imagewise exposure to the abraded surface, whereby the coating thickness is selected so that the roughness caused by the abrasion process is substantially equalized, e.g., to a thickness tolerance of about 2 μm or less. Thermoplastic binders suitable for this purpose are widely known, e.g., from German Pat. No. 1 210 321. Individual examples are: polyvinyl alcohol, polyvinyl pyrrolidone, polyethylene oxide, polyamide, polyvinyl acetate, polybutylmethacrylate, polyacrylic acid, polymethacrylic acid and their copolymers with acrylic acid and methacrylic acid esters or amides, as well as partially and/or completely saponified maleic acid anhydride containing copolymers. Moreover, carboxylated copolymers of styrene, butadiene, isoprene, or acrylonitrile, as well as natural polymers such as alginic acid, pectinic acid, gelatin, albumin, or casein. Preferably the thermoplastic binder is selected so that it is soluble in the liquid development or washoff solution for the photohardenable material. This has the advantage, that the fill-in layer can be removed without additional expenditure of work during the normal washoff process. Thermoplastic binders soluble in aqueous and/or aqueous-alkalinic solutions are especially valuable in this connection.

In case the binder is insoluble in the liquid development or washoff solution, it is necessary to remove the layer applied to fill in the abraded relief by treatment in a suitable solvent before normal washoff. Good results in terms of the attainable increase of the number of impressions are achieved when the thermoplastic binder is applied in a solvent which partially dissolves the surface of the photohardenable material.

A solution of a copolymer of acrylic acid and acrylic acid methyl ester (10/90 mol-%) in a mixture of tetrachloroethylene and n-butanol (1:1 part by volume) has proven to be especially suitable.

The solutions for filling in the abraded relief, in addition to the thermoplastic binder, can contain other additives, e.g., wetting agents or dyes. It is, also, advantageous for the purposes of the present invention to use thermoplastic binders which are not tacky, for filling in the abraded relief. In this case, the use of a distinct separator layer and/or separating agents becomes unnecessary. Such separator layers or separating agents frequently are required in order to protect the original from damage and to permit easy removal of the original from the printing plate after exposure. Application of the "filling-in solutions" can be manual, e.g., by painting, by treating with tampons, sponges, etc; saturated with the polymer solution or by wiping on with a doctor blade.

Should the surface of the photohardenable material have a tendency to be tacky as a result of its composition, it will be necessary to apply known separator layers, e.g., a thin polyamide layer, before exposure or to use known types of separating compounds, such as e.g., silicones.

INDUSTRIAL APPLICABILITY

With the aid of the described process the printing quality of practically all known photohardenable materials for relief printing which contain a thermoplastic binder and whose surface has been abraded for technical application purposes can be improved so that the printing plates produced therefrom are substantially equivalent to unabraded printing plates in relief depth, number of impressions and printing quality. The type of photohardenable materials are widely known and are described, e.g., in German Pat. Nos. 1 031 130, 1 093 209, and 1 522 470. Photohardenable materials which contain a thermoplastic, elastomeric binder are of special significance, because these materials are frequently used for the production of seamless printing plates and/or printing cylinders. Such materials are disclosed, e.g., in German Pat. No. 2 215 090, German OS No. 2 138 582, and German OS No. 2 223 808.

It is surprising, that loss of quality caused by the abrasion process can be overcome by such simple means. Those skilled in the art would rather expect, that the surface properties of photohardenable materials would be permanently changed by the abrasion process as a result of local thermal overheating, partial thermal polymerization, and the loss of volatile ingredients. It is, therefore, completely surprising that the surface of photohardenable materials can be restored by the simple aftertreatment methods of this invention so that the photohardenable surface corresponds to the original nonabraded material with respect to reproduction detail and number of runs of impressions. Those skilled in the art, moreover, would expect that the described technology of filling in the abraded relief would lead to differences in thickness within the photohardenable material and therefor would cancel out the action of the preceding abrasion process.

EXAMPLES

The following examples are intended to illustrate the invention but not limit it.

EXAMPLE 1

Two flexoprinting plates A and B produced according to the procedure of Example 5 of German Pat. No. 2 215 090 are each mounted seamless onto a printing cylinder and are abraded to a thickness variation of ±0.01 mm to attain the required symmetry of rotation. The depth of grooves ranges up to about 16 μm. While plate A remains unchanged, the abraded relief of plate B is smoothed by a heat and pressure treatment. The printing cylinder with plate B, for this purpose, is supported between two roller bearings. A rotating metal roller with a smooth, polished surface and a rotation axis parallel to that of the printing cylinder is heated to 115° C., brought in contact with the surface of plate B fixed onto the printing cylinder, and subjected to a pressure of 0.2 kg/cm$^2$. The printing cylinder is thus driven to rotate at the same lineal speed as the polished roller. After about 5 minutes the metal roller is removed and the plate surface is cooled, a smooth, glossy surface being obtained. The depth of grooves of plate B is about 2 μm or less.

Subsequently a thin separator layer comprising a copolymer of styrene and a maleic acid anhydride partially esterified with secondary butyl alcohol (58/42 mol-%) is applied. The coating is applied as a 5% solution in ethanol/butanol (1:1 volume parts). Plates A and B, as well as an untreated flexoprinting plate C of the same composition which was fixed onto the printing cylinder, were exposed at a distance of 20 cm using a circular exposure device with 20 cylindrically arranged 60-W ultraviolet lamps for 7 minutes through a screen original. Subsequently, the unexposed image portions were washed off for 5 minutes at 20° C. with a solution of the following composition:

Tetrachloroethylene: 75 vol.-%
n-butanol: 25 vol.-%

To evaluate the obtained relief depth of each of the three plates, the relief depth was measured using a Zeiss optical microscope for measurement of gravure cells. Additionally the number of runs of impressions was determined. The obtained results are summarized in Table 1:

TABLE 1

| Plate | Average Relief Depth (μm) | No. of Impressions |
|---|---|---|
| A | 17 | 50,000 |
| B | 30 | 500,000+ |
| C | 33 | 500,000+ |

EXAMPLE 2

A flexoprinting plate produced according to the data of Example 1 is mounted seamless onto a printing cylinder and is abraded to a thickness variation of ±0.01 mm. The flexoprinting plate is then rolled over a smooth, polished metal surface heated to 120° C. at a pressure of 0.6 kg/cm$^2$. The plate is additionally treated according to the procedure of Example 1. The result is a printing plate with a smooth, glossy surface which, in reference to its relief depth and numbers of impressions, corresponds to a nonabraded printing plate of the same composition.

EXAMPLE 3

An abraded, coarse relief printing plate produced according to the procedure of Example IV of U.S. Pat. No. 3,927,022 is rolled using a smooth, polished metal cylinder heated to 110° C. The contact pressure is ca. 0.5 kg/cm². This treatment eliminates the surface coarseness of the relief printing plate and the surface of the printing plate has a glossy appearance comparable to the nonabraded starting material. Processing the plate is also according to the procedure of Example IV of U.S. Pat. No. 2,927,022. The reproduction detail attainable in the print corresponds to that of the nonabraded plate.

EXAMPLE 4

Two flexoprinting plates A and B produced according to the procedure of Example 1 are each mounted seamless onto a printing cylinder each and are abraded to a thickness variation of ±0.01 mm to attain the necessary truth of rotation. While plate A remains unchanged, plate B is dipped while slowly turning at a uniform speed (ca. 4-5 rpm) in a bath of 1,1,1-trichloroethane so that only the plate surface comes in contact with the solvent. After a treatment of ca. 10 to 20 seconds the plate is dried. Subsequently a thin separator layer consisting of a copolymer of styrene and a maleic acid anhydride esterified partially with secondary butyl alcohol (58/42 mol-%) is coated onto the surface of plates A and B. The coating is applied as a 5% solution in ethanol/butanol (1:1 volume parts). Plates A and B, as well as a nonabraded flexoprinting plate C of the same composition used for comparative purposes which was fixed onto the printing cylinder, are exposed and washed off according to the procedure of Example 1. Relief depth and the number of impressions is determined for each of the three plates as described in Example 1. The results obtained are summarized in Table 2:

TABLE 2

| Plate | Average Relief Depth (μm) | No. of Impressions |
|---|---|---|
| A | 17 | 50,000 |
| B | 33 | 500,000 |
| C | 33 | 500,000 |

EXAMPLE 5

An unexposed, coarse flexoprinting plate produced according to the procedure of Example 1 with a roughness of ±10 μm is fixed onto a round cylinder and the surface of the printing plate is passed through a solvent bath of the following composition while turning at a uniform speed (ca. 4-5 rpm):
Tetrachloroethylene: 75 vol.-%
n-butanol: 25 vol.-%
and then is dried.

The dry flexoprinting plate is removed from the cylinder. Subsequently a separator layer comprising a 10% by weight aqueous solution of polyvinyl alcohol containing a nonionized wetting agent based on a fluorinated hydrocarbon is applied to the surface of the plate. The plate is then exposed for 7 minutes in a flat exposure device (20 UV lights of 60 W, distance 15 cm), through an original. After exposure the separator layer is washed off with water, and the flexoprinting plate is washed off with a solvent mixture of tetrachloroethylene and butanol (75:25 vol.-%). The plate surface and the reproduction detail quality are equivalent to that of a nonabraded plate. Relief depth is determined as in Example 1 and is compared to the relief depth of a rough, untreated flexoprinting plate and a nonabraded flexoprinting plate. The results are summarized in Table 3:

TABLE 3

| Plate | Average Relief Depth (μm) |
|---|---|
| Nonabraded plate | 33 |
| Abraded, untreated plate | 17 |
| Abraded plate treated according to Example 5 | 32 |

EXAMPLE 6

Two flexoprinting plates A and B produced according to the procedure of Example 1 are each mounted seamless onto a printing cylinder and are abraded to a thickness variation of ±0.01 mm. While plate A remains unchanged, the abraded relief of plate B is smoothed by applying a 15% ammoniacal aqueous solution of a mixture of a copolymer comprising methyl methacrylate, ethyl methacrylate, and acrylic acid (37/56/7 mol-%) and a copolymer of styrene and maleic acid anhydride esterified partially with secondary butyl alcohol (58/42 mol-%) at a weight ratio of 1:1, whereby the coating thickness is selected so that after drying the roughness caused by the abraded relief is equalized. Plates A and B, and a nonabraded flexoprinting plate C used for comparative purposes, are fixed onto the printing cylinder and are exposed according to the procedure of Example 1. Subsequently, the filled-in layer is removed by washing with an aqueous alkaline solution. The printing plate is then washed off for 5 minutes at 20° C. using a solvent mixture of:
Tetrachloroethylene: 75 vol.-%
n-butanol: 25 vol.-%

Relief depth and the number of impressions are determined as described in Example 1. The obtained results are summarized in Table 4:

TABLE 4

| Plate | Average Relief Depth (μm) | No. of Impressions |
|---|---|---|
| A | 17 | 50,000 |
| B | 30 | 400,000 |
| C | 33 | 500,000+ |

EXAMPLE 7

Two flexoprinting plates A and B produced according to the procedure of Example 1 are each mounted seamless onto a printing cylinder and are abraded to a thickness variation of ±0.01 mm. While plate A remains unchanged, the abraded relief of plate B is smoothed by the application of a 10% aqueous polyvinyl alcohol solution which additionally contains a nonionic wetting agent, whereby the coating thickness is selected so that after drying the roughness caused by the abraded relief is equalized. Plates A and B, and a nonabraded flexoprinting plate C used for comparative purposes, are exposed and washed off according to the procedure of Example 1 after the polymer film had previously been washed off with water. Relief depth and the number of impressions on each of the three plates are determined as described in Example 1.

The obtained results are summarized in Table 5:

TABLE 5

| Plate | Average Relief Depth (μm) | No. of Impressions |
|---|---|---|
| A | 17 | 50,000 |
| B | 25 | 200,000+ |
| C | 33 | 500,000+ |

EXAMPLE 8

The flexoprinting plates A and B produced according to the procedure of Example 1 are each mounted seamless onto a printing cylinder and are abraded to a thickness variation of ±0.01 mm. While plate A remains unchanged, the abraded relief of plate B is smoothed by applying a 20% alcoholic solution of polyvinyl pyrrolidone, whereby the coating thickness is selected so that after drying the roughness caused by the abraded relief is exactly equalized. Plates A and B, and a nonabraded flexoprinting plate C used for comparative purposes, are then exposed and washed off according to the procedure of Example 1. Relief depth and the number of impressions of each of the three plates are determined. The obtained results are summarized in Table 6:

TABLE 6

| Plate | Average Relief Depth (μm) | No. of Impressions |
|---|---|---|
| A | 17 | 50,000 |
| B | 28 | 200,000+ |
| C | 33 | 500,000+ |

EXAMPLE 9

The surface of an abraded flexoprinting plate produced according to the procedure of Example 1 was irradiated on a flat support for 1 minutes at a distance of 35 cm using a heat ray device (2×1000 watts). The temperature in the vicinity of the plate was 140° C. After cooling down, the printing plate was provided with a separator layer according to Example 1, was exposed according to the procedure of Example 1, and subsequently was washed off using a solvent mixture of:

Tetrachloroethylene: 75 vol.-%
n-butanol: 25 vol.-%.

The depth of the obtained relief was equivalent to that of a nonabraded comparative printing plate of the same composition.

We claim:

1. A process for improving the printing quality of dry photohardenable reproduction materials for the production of relief printing plates consisting essentially of
   (a) abrading the dry photohardenable surface of the material which consists essentially of a photopolymerizable or photocrosslinkable compound, a thermoplastic binder, and an initiator and/or an initiator system thereby forming a rough surface in the photohardenable material with grooves in the range of about 5 to 20 μm depth.
   (b) smoothing the abraded dry photohardenable surface by filling in the abraded surface by a treatment taken from the group consisting of
      (1) heat and/or pressure treatment,
      (2) treatment with an organic solvent and/or solvent mixture for the thermoplastic binder of the photohardenable material, and
      (3) treatment with a thermoplastic binder dissolved in a solvent,
   the surface having a depth of grooves no greater than about 2 μm after the treatment
   (c) exposing the smoothed surface imagewise to actinic radiation, and
   (d) removing the unexposed areas of the smoothed surface by liquid development.

2. Process according to claim 1 wherein the abraded surface is smoothed by a heat and/or pressure treatment.

3. Process according to claim 1 wherein the abraded surface is smoothed by a combined heat and pressure treatment.

4. Process according to claim 2 wherein the heat and/or pressure treatment is carried out at temperatures between 100° and 120° C. and the exerted pressure is in the range of 0.05–0.6 kg/cm$^2$.

5. Process according to claim 1 wherein the abraded surface before imagewise exposure is smoothed by a treatment with an organic solvent and/or solvent mixture for the thermoplastic binder of the photohardenable layer.

6. Process according to claim 5 wherein trichloroethane or tetrachloroethylene is used as solvent.

7. Process according to claim 1 wherein the abraded surface before imagewise exposure is smoothed by applying a thermoplastic binder dissolved in a solvent.

8. Process according to claim 7 wherein a thermoplastic binder is used which is soluble in the liquid development solution for the photohardenable material.

9. Process according to claim 7 wherein the abraded surface is smoothed by the simultaneous application of a thermoplastic binder and a solvent and/or solvent mixture for the photohardenable material.

10. Process according to claim 1 wherein the abrading and smoothing treatments occur while the photohardenable reproduction material is on a cylinder.

* * * * *